(12) United States Patent
Wang

(10) Patent No.: US 8,455,900 B2
(45) Date of Patent: Jun. 4, 2013

(54) SEMICONDUCTOR LIGHT-EMITTING DEVICE HAVING AN OPTICAL MEMBER, AND METHOD OF MANUFACTURING THE SAME

(76) Inventor: Tien Yang Wang, Lexington, MA (US)

(*) Notice: Subject to any disclaimer, the term of this patent is extended or adjusted under 35 U.S.C. 154(b) by 151 days.

(21) Appl. No.: 13/174,782

(22) Filed: Jul. 1, 2011

(65) Prior Publication Data

US 2013/0001611 A1 Jan. 3, 2013

(51) Int. Cl.
*H01L 33/08* (2010.01)
*H01L 33/58* (2010.01)

(52) U.S. Cl.
USPC .... 257/98; 257/95; 257/E33.068; 257/E33.06

(58) Field of Classification Search
None
See application file for complete search history.

(56) References Cited

U.S. PATENT DOCUMENTS

| | | | |
|---|---|---|---|
| 6,071,795 A | 6/2000 | Cheung et al. | |
| 6,639,354 B1* | 10/2003 | Kojima et al. | 313/498 |
| 7,554,109 B2* | 6/2009 | Stokes et al. | 257/17 |
| 2010/0200808 A1 | 8/2010 | Hafiz | |

OTHER PUBLICATIONS

Marquezini, M. V., J. Tignon, T. Hasche, and D. S. Chemla. "Refractive Index and Absorption of GaAs Quantum Wells across Excitonic Resonances." Applied Physics Letters 73.16 (1998): 2313.*
Wensel, Hans. "Improved Theory of Refractive-Index Change in Quantum-Well Lasers." IEEE Journal of Selected Topics in Quantum Electronics 5.3 (1999): 637-42.*
Cheng, C; Spectral Characteristics of CdSe Quantum Dots, IEEE Spectroscopy and Material Properties, p. 494 (2006).*
Sun, X. W., and H. S. Kwok. "Optical Properties of Epitaxially Grown Zinc Oxide Films on Sapphire by Pulsed Laser Deposition." Journal of Applied Physics 86.1 (1999): 408.*
Basic Properties of BN downloaded from URL< http://www.ioffe.rssi.ru/SVA/NSM/Semicond/BN/basic.html> Dec. 3, 2012.*
C. S. Xia; W. Lu; Z. M. Simon Li; Z. Q. Li; , "Simulation of InGaN/GaN multiple quantum well light-emitting diodes with Quantum Dot electrical and optical effects," Numerical Simulation of Semiconductor Optoelectronic Devices, 2006. NUSOD '06. International Conference on pp. 15-16, Sep. 2006.*
Xai, C. S. "Simulation of InGaN/GaN Multiple Quantum Well Light-emitting Diodes with Quantum Dot Electrical and Optical Effects." International Conference on Numerical Simulation of Semiconductor Optoelectronic Devices. Canada. Sep. 2006. Lecture.*
Y.S. Park, Index of Refraction of ZnO, Journal of Applied Physics, vol. 39, No. 7, pp. 3049-3052, Jun. 1968.*

* cited by examiner

*Primary Examiner* — Thomas L Dickey
*Assistant Examiner* — Joseph Schoenholtz
(74) *Attorney, Agent, or Firm* — SV Patent Service

(57) ABSTRACT

A light-emitting device includes a light emitting structure comprising a lower layer of the first conductivity type, an active layer, an upper layer of the second conductivity type, a first electrode connected to the lower layer of the first conductivity type, a second electrode connected to the upper layer of the second conductivity type, and an optical member seeded in the light emitting structure. The optical member can include a plurality of particles substantially transparent and having a lower refractive index than the light emitting structure. A plurality of discontinuities are formed at the boundary of the optical member in the light emitting structure.

22 Claims, 8 Drawing Sheets

SEMICONDUCTOR LIGHT-EMITTING DEVICE HAVING AN OPTICAL MEMBER, AND METHOD OF MANUFACTURING THE SAME

BACKGROUND OF THE INVENTION

The present invention relates generally to the fabrication of semiconductor light emitting devices (LED). In particular, the present invention relates to an LED with improved luminance efficiency.

In a conventional white LED package for lighting and display applications, the GaN LED chip is attached to a lead frame and sealed in a resin containing phosphor particles. The phosphor particle absorbs the blue radiation from the chip and emits light in yellow-green and red. The overall light output of the package is perceived as white to human eyes. There are several issues in this structure. For example, a significant portion of the light emitted from the active layer is trapped within the chip and is lost before exiting the chip end. This is due to wave guiding from internal reflection. The trapped light is reabsorbed when reflecting across the active layer. As a result, the luminance efficiency of the LED is impaired. This is generally referred to as light trapping in the current LED. Moreover, it causes uneven conversion of light by the phosphor particle in the package. The light output profile from the package is unsymmetrical and a complex lens is often required to shape the beam profile.

The problem of light trapping can be relaxed by implementing a scattering surface to minimize the wave guiding effect. This can be achieved by roughening the chip surface by using chemical etching from the top surface after the growth of the LED is complete. Surface roughening can be also achieved by depositing the top layer under a less optimal growth condition such as at a lower temperature and a low V/II ratio. Alternatively, scattering surface structures can be formed on the substrate. However, these techniques often require the use of complicated processing procedures and the fabrication cost is high. Layer deposition under less optimal growth conditions adversely impacts the quality of the LED layers and may decrease the device efficiency. Etching from the top surface after growing the LED structure excavates a significant portion of the land from the estate. A significant portion of the LED material grown using the expensive MOCVD process is stripped off and wasted. The active area available for light generation is largely sacrificed thus the power output of the device is low. Since the rough surface is formed after the LED structure is grown, it does not address the problem related to misfit defect and crack formation.

There are other issues with the current LED package. In a typical LED package, the phosphor particles are either suspended in the resin or settled to the bottom of the lead frame. In brief, the phosphor powder and the resin gel are weighed separately and mixed together. A minute amount of the mixture is metered and dropped in the package to seal the LED chip. The package lead frame is transferred to an oven and kept at a fixed temperature and humidity just waiting for the powders to settle. After that, it is brought to a high temperature and the resin cures into a solid. Each step causes process variations leading to a wide spread of the output color of the packaged device. This is generally referred to as color binning on the CIE chromaticity diagram. Special techniques are in order to achieve a uniform light output in a narrow color bin using a different scheme for the phosphor incorporation, but these techniques often produce further complications in the fabrication of the white LED.

SUMMARY OF THE INVENTION

The present light emitting device can overcome aforementioned deficiencies. The present invention may include one or more of the following advantages. The present light emitting device allows for a quick exit of the trapped light thus the luminance efficiency is improved. The present invention is most beneficial for the fabrication of large light emitting devices which suffer more severe light trapping. The presently disclosed device allows for light mixing in-situ in the LED structure. The optical loss at interfaces is effectively alleviated. As a result, the present device is most suitable for efficient white light generation at a reduced packaging cost.

In one general aspect, the present invention relates to a light-emitting device that includes a light emitting structure comprising a lower layer of the first conductivity type, an active layer, an upper layer of the second conductivity type; a first electrode connected to the lower layer of the first conductivity type; a second electrode connected to the upper layer of the second conductivity type; and an optical member seeded in the light emitting structure, wherein the optical member comprises a plurality of particles substantially transparent and having a lower refractive index than the light emitting structure, wherein a plurality of discontinuities are formed at the boundary of the optical member in the light emitting structure.

Implementations of the system may include one or more of the following. The optical member can be seeded in the light emitting structure through the lower layer. The plurality of discontinuities can be generated in situ during the deposition of the light emitting structure. The light emitting structure can include materials selected from the group of III-V, II-VI semiconductor materials. The optical member can include solid or hollow particles of uneven sizes, shapes, and spacing. A portion of the optical member can protrude out of an outer surface of the light emitting structure. The light emitting structure can be leveled to render a flat surface of the light emitting structure. The light-emitting device can further include a substrate comprising a first surface, wherein the light emitting structure is disposed on the first surface of the substrate. The substrate can be selected from the group comprising group III-V, group IV, group II-VI elements and alloys, ZnO, spinel and sapphire. The light-emitting device can further include a textured district defined on the first surface of the substrate, comprising a plurality of ditches in the form of a cavity, trench, mound, mesa, plateau, growth post and combinations thereof, the optical member is spatially coupled to the textured district. The light-emitting device can further include a first layer disposed on the first surface of the substrate having a plurality of surface pits from the misfit dislocation defects in the first layer, wherein the optical member is spatially coupled to the a plurality of surface pits. The optical member can include a cavity in the light emitting structure. The cavity can be filled with a gas, a phosphor material, a resin, a metallic material, a reflective material, a semiconductor material, a ceramic material, a conductive material, or a heat dissipating material. An optoelectronic system for lighting and display applications can include the light-emitting device, which is incorporated in the form of wire bonding, flip chip bonding, surface mounted, or power package.

In another general aspect, the present invention relates to a light-emitting device, that include a light emitting structure comprising a lower layer of the first conductivity type, an active layer, an upper layer of the second conductivity type; an electrode connected to the lower layer of the first conductivity type; an electrode connected to the upper layer of the second conductivity type; and an optical member seeded in the light emitting structure, wherein the optical member comprises particles that absorb a portion of the radiation in the first range of the spectrum from the active layer and emits a radiation in a second range of the spectrum, wherein a plurality of discontinuities are formed at the boundary of the optical member in the light emitting structure.

Implementations of the system may include one or more of the following. The optical member comprises phosphor. The optical member can be seeded in the light emitting structure through the lower layer. The radiation in a second range of the spectrum emitted by the optical member and the radiation in the first range of the spectrum from the active layer can be color mixed and perceived as white to the naked eye. A portion of the optical member can protrude out of an outer surface of the light emitting structure. The light emitting structure can be leveled to render a flat surface of the light emitting structure. The light-emitting device can further include a substrate comprising a first surface, wherein the light emitting structure is disposed on the first surface of the substrate. The light-emitting device can further include a textured district on the first surface of the substrate whereupon the light emitting structure is disposed, wherein the textured district comprises a plurality of ditches in the form of a cavity, trench, mound, mesa, plateau, growth post, or a combination thereof, wherein the optical member is spatially coupled to the textured district. The optical member can be spatially coupled to the plurality of ditches. The light-emitting device can further include a first layer disposed on the first surface of the substrate having a plurality of surface pits from the misfit dislocation defects in the first layer, wherein the optical member is spatially coupled to the plurality of surface pits. An optoelectronic system for lighting and display applications can include the light-emitting device which is incorporated in the form of wire bonding, flip chip bonding, surface mounted, or power package. The present invention will be best described in detail with reference to the figures listed and is described below.

DETAILED DESCRIPTION OF THE INVENTION

Figure 1:
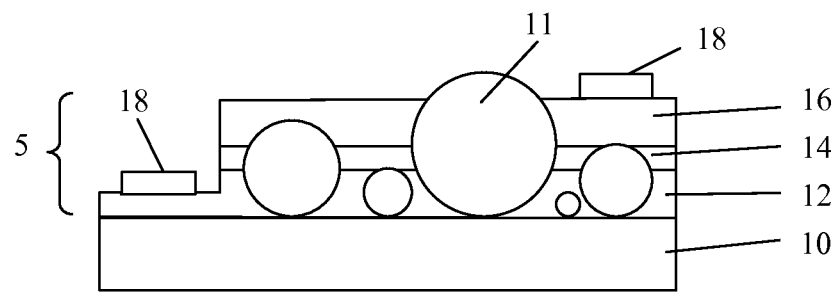
FIG. 1 is a cross-sectional view illustrating an LED according to an embodiment of the present invention that has an inclusion of optical member such as transparent particles in the LED structure.

Referring to FIG. 1, a light emitting structure 5 is grown on a substrate 10 comprising a lower layer of the first conductivity type 12, an active layer 14, an upper layer of the second conductivity type 16. The present device can be fabricated using the conventional methods such as metal organic vapor phase epitaxy (MOVPE) and hydride vapor phase epitaxy (HVPE). The layer growth process is well known to one skilled in the field. For example, a GaN LED structure is fabricated by growing an n-type GaN layer 12 on a sapphire substrate 10. A buffer layer (not shown) can be inserted to improve the layer quality. An active layer of InGaN layer 14 is then deposited on the n-type GaN layer 12 and the light emitting structure 5 is completed with a p-type GaN layer 16 on top. The light emitting structure 5 can be made of a variety of materials such as the group III-V materials, group IV, group II-VI materials. Suitable substrates can include the group III-V, group IV, group II-VI elements, alloys, oxides such as ZnO, spinel, and sapphire. In the present device, an optical member 11 is seeded in the light emitting structure 5 on the substrate side. The optical member can include a plurality of particles, which is substantially transparent to the light emitted from the device. Examples of such a material include silica ($SiO_2$), alumina ($Al_2O_3$), silicon nitride ($SiN_x$), $ZrO_2$, or ZnO. Preferably, the index of refraction of the optical member is less than that of the material in the light emitting structure 5. The optical member 11 can be in a form of a solid particle, a microsphere, a nanosphere, a hollow sphere. The size of the optical member may vary from few nanometers to 50 μm, preferably from 0.1 μm to 10 μm. It can be readily applied to the substrate surface by a conventional dispensing method such as spin coating using a colloidal solution. After drying, the processed wafer is loaded in the MOCVD growth chamber where the layer deposition commences. The neighboring particles may become connected in part as a result of surface fusion at the high temperature during the deposition of the semiconductor structures. For viewing clarity, the optical member 11 is illustrated as a single particle in the drawings of the present application. It should be understood that the optical member in the present invention is compatible with an aggregate of particles, an agglomerate of particles, which are formed by one material or a mixture of different materials. The presently disclosed apparatus is compatible with different particle sizes and the particle size distributions. For example, the size distribution can be Gaussian, non-Gaussian, lognormal, skew normal, single modal, bimodal, multi-modal, to name just a few. The median size and spread of the distribution can be the same or different. It is also understood that the manner the optical member is distributed in the LED structure can be regular or irregular in terms of the particle size, particle shape, particle type, and the spacing between the particles. After the layer growth is complete, the wafer is unloaded from the growth chamber and subjected to further processing. Contact electrodes 18 are formed connecting each of the layers of each conductivity type. The device is energized by drawing currents from an external power supply through the electrodes.

The optical member in the present device can be particles of various shapes. Preferably it is substantially rounded in shape to facilitate a smooth layer growth of the light emitting structure 5. As illustrated in FIG. 1, the optical member 11 may be optionally of even or uneven size, shape, and spacing. The local growth rate may vary due to different supply of adatoms migrating from the surface of the optical member. Accordingly, the peak emission wavelength of the light emitting structure 5 may also become position dependent. The optical member shown in FIG. 1 is seeded in the light emitting structure 5 from the substrate side. It is understood that additional layers (not shown for clarity) can optionally be disposed and the optical member can be readily seeded in the light emitting structure 5 from these layers instead of from the substrate interface. The additional layer can be of the same or different material as the lower layer of the first conductivity type. Either way, a plurality of discontinuities is generated in the light emitting structure bordering the optical member in the present device. Such discontinuities behave as local end faces where the light may radiate out of the light emitting structure 5. The abundance of such end faces in the light emitting structure 5 greatly enhances the probability for the trapped light to escape before being wave guided to the end of chip. Thus the optical loss due to light absorption in the active region from internal reflection is much reduced. As a result, the device in the present invention has improved luminance efficiency and the deficiency in the prior art devices is effectively alleviated in the present device.

The discontinuities in said light emitting structure bordering the optical member may be generated in situ during the deposition of the light emitting structure. In this case, the layer deposition around the optical member facilitates the layer growth in the lateral direction. A significant portion of the misfit dislocation defects from the initial layer growth are directed to and are terminated at the boundary bordering the optical member and the LED structure. This represents another benefit of using the device in the present invention. The optical member can further serve as a stress absorber in the LED structure. The thermal stress may be evenly dissipated across the wafer before reaching the threshold for crack generation. This represents still another benefit using the present device over the prior art devices.

Figure 2:
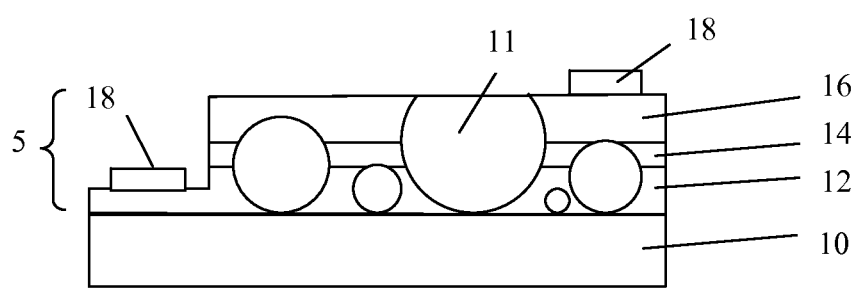
FIG. 2 is a cross-sectional view illustrating an LED that has a leveled surface according to the present invention.

In the present device, the optical member in the LED structure can be optionally placed in a single layer, across different layers, across the entire LED structure, or having a portion protruding the surface of the LED structure. When a planar surface is desirable for easy chip processing, a portion of the optical member protruding the surface of the LED structure may be leveled to render a flat surface of the present device. A cross sectional view of the device in this embodiment of the present invention is illustrated in FIG. 2.

In some embodiments, addition layers (not shown in the Drawings for clarity) can be optionally incorporated to the present device for desirable properties. For example, a current spreading layer such as a transparent metal film, e.g. Ni/Au, or a transparent conductive oxide film, e.g. indium tin oxide (ITO) can be incorporated to the layer surface before laying down the contact electrodes. Thus the present device advocates a uniform current injection and a uniform light emission. It is even more beneficial when using an optical member that is substantially nonconductive such as silica particles or phosphor particles. In this case, the optical member also serves as a current blocking member that would further reduce the adverse effect of current crowding. The chance for local heating due to current crowding in the prior art devices is much reduced using the present device. As another example, a conventional reflective layer such as a metal film, e.g. Ag, Au, Al, a dielectric mirror stack, e.g. a $SiO_2/TiO_2$ quarter waver plate, or a multilayer high reflectance coating, e.g. $Ag/SiO_2/TiO_2$ layers can be optionally incorporated to the layer surface or become part of the contact electrode. In this case, the light can be bounced off the bonding surface and exit the top surface of the chip. This advocates a high luminance efficacy of the present device.

Figure 3:
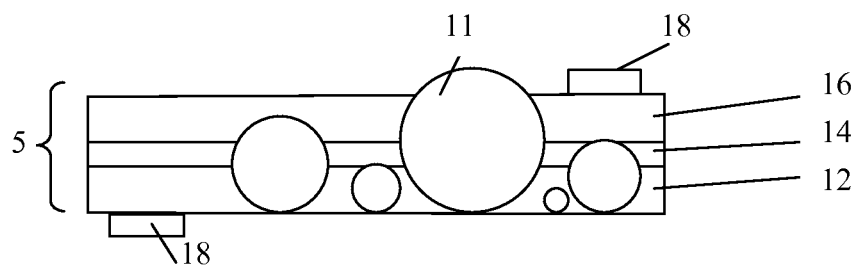
FIG. 3 is a cross-sectional view illustrating an LED with the substrate removed according to the present invention.
Figure 4:
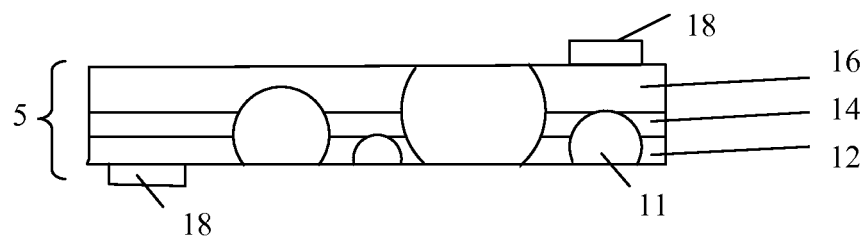
FIG. 4 is a cross-sectional view illustrating an LED that has a portion of the optical member exposed to the surface according to the present invention.
Figure 5:
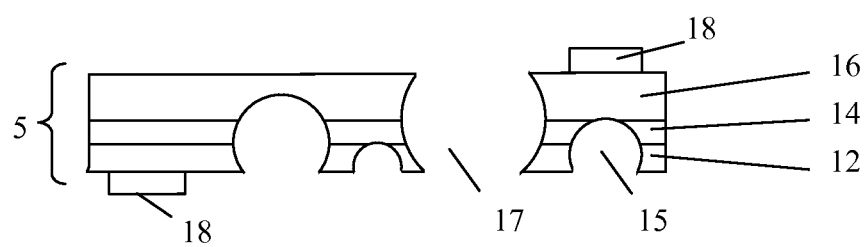
FIG. 5 is a cross-sectional view illustrating an LED that has cavities in the LED structure according to the present invention.
Figure 6:
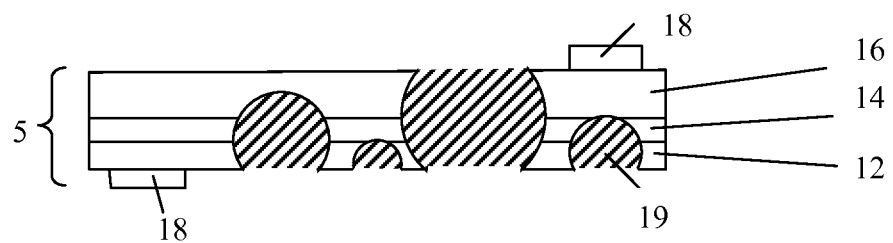
FIG. 6 is a cross-sectional view illustrating an LED that has foreign substances filled in the cavities according to the present invention.

In some embodiments, a temporary substrate may be employed to facilitate smooth layer growth of the LED structure. It can be removed after the LED structure is grown using the conventional methods such as lapping, etching, chemical mechanical polishing (CMP), or laser lift off methods (LLO). The wafer may be bonded to a carrier wafer (not shown for clarity) before the substrate removal for easy wafer handling. A cross sectional view of the device in this embodiment of the present invention is illustrated in FIG. 3. Since the absorption coefficient of sapphire and phosphor is very different from that of GaN, the layer structure can be separated from the substrate by the 248 nm radiation from a KrF pulsed excimer laser in the laser lift off method (LLO). This radiation passes through sapphire and is absorbed by GaN, causing decomposition of the GaN layer proximate to the substrate interface into metallic gallium and gaseous nitrogen. Details of the LLO process for substrate removal have been described by Cheung et al in U.S. Pat. No. 6,071,795. After substrate removal, the wafer may be subjected to a further processing step such as kiss polishing to remove a thin skin of material from either surface of the LED structure. This way a portion of the optical member that was originally seeded from layers within the LED structure instead of from the substrate interface may be also brought to the new surface and exposed to the ambient. A cross sectional view of the device in this embodiment of the present invention is illustrated in FIG. 4. The optical member may be optionally removed from the LED structure by etching through the exposed area. For example, the silica particles are readily etched off from the LED structure through the openings by dipping the wafer in a buffered oxide etching (BOE) solution. After removal of the optical member from the LED structure, cavities such as voids 15 and through holes 17 are left behind in the LED structure. A cross sectional view of the device in this embodiment of the present invention is illustrated in FIG. 5. In this particular case, the present device resembles the appearance of a Swiss cheese or a sponge. There is an abundance of such openings in the present device where the trapped light may readily exit. In still another embodiment of the present invention, the cavities are optionally filled with a foreign substance 19. This is illustrated in FIG. 6, which is a simplified cross sectional view of the device according to the present invention. There is no practical restraint of the type of the material to be used as the foreign substance filling the cavities. Various types of substances such as air, gas, phosphor, resin, metal, reflective material, semiconductor, ceramic, conductive material, heat dissipating material can be incorporated this way to the device according to the embodiment of the present invention to further improve the performances of the device.

Figure 7A:
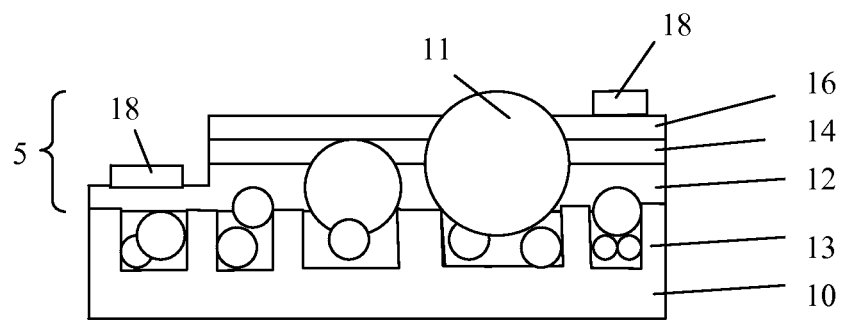
FIGS. 7A-7C are cross-sectional views illustrating an LED that has an inclusion of optical member spatially coupled to a textured district of various shapes such as rectangular, trapezoidal, and honeycomb-like according to the present invention.
Figure 7B:
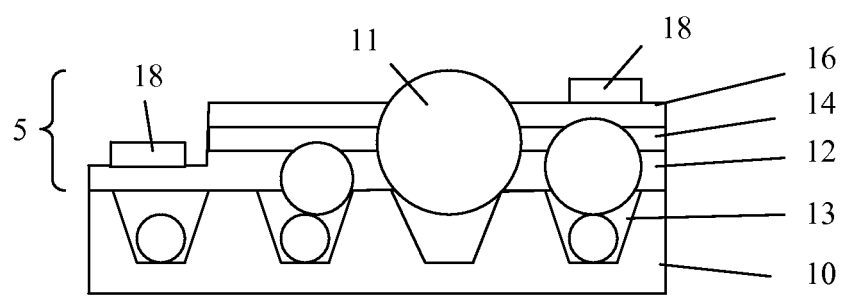
Figure 7C:
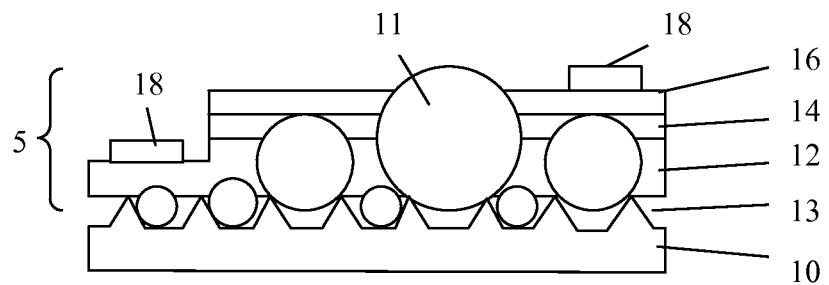
Figure 8A:
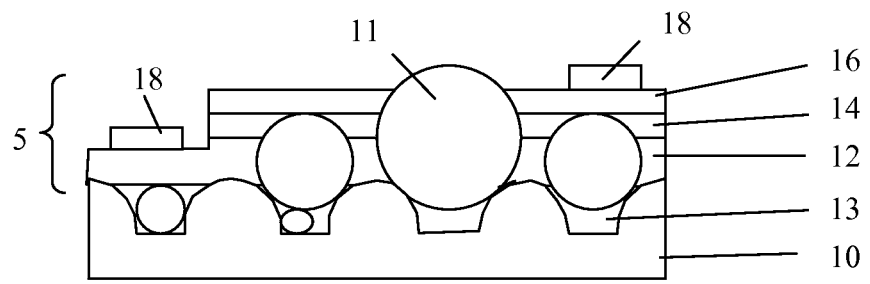
FIGS. 8A-8D are cross-sectional views illustrating an LED that includes an optical member spatially coupled to a textured district of a rounded shape, subsequent removal of the substrate and the optical member, and back filling with a foreign substance according to the present invention.
Figure 8B:
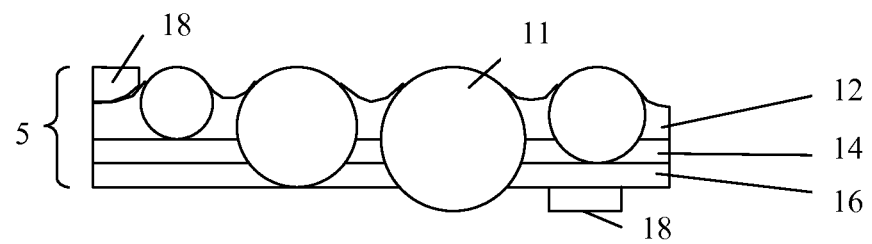
Figure 8C:
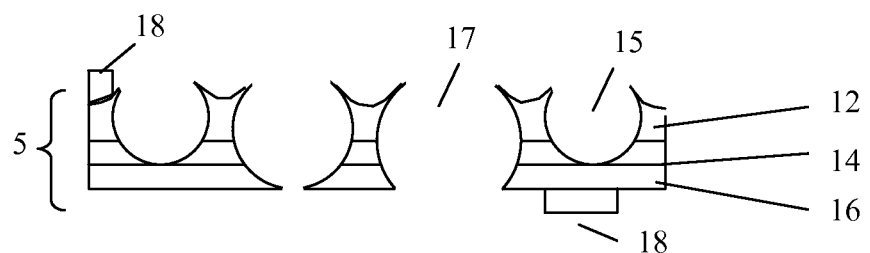
Figure 8D:
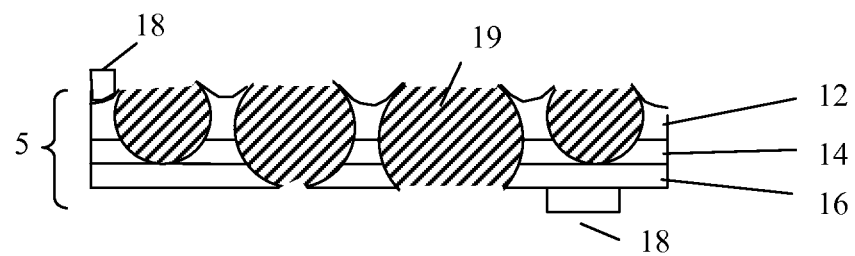

In some embodiments, the optical member is spatially coupled to a textured surface district and thus is retained in designated sites in the LED structure. This is achieved by first forming a textured district on the substrate surface before forming the LED structure. The textured district is defined in a desirable pattern using the conventional photolithographic etching methods. The optical member such as silica particles are dispersed in a suitable solvent and spin coated over the patterned substrate wafer. After drying, the substrate wafer is transferred into an MOCVD growth chamber and the growth of the LED structure commences. FIG. 7A is a simplified cross-sectional view diagram illustrating an embodiment of the device in the present invention. The textured district may comprise, for example, a plurality of ditches 13 in the form of a cavity, trench, mound, mesa, plateau, growth post and combinations thereof. The particles are then disposed in the ditches 13 and the growth of the LED structure follows. The optical member 11 is thus spatially coupled to the textured district. The smaller particles tend to settle in the ditch, while the larger ones tend to ride on the ditches. In this embodiment, the ditches may be even or uneven and may be of various size, shape and spacing. For example, it may substantially assume a cross-sectional shape of a rectangle, a trapezoid, or collectively as a honeycomb structure. This is illustrated in FIGS. 7A-7C respectively. It may be also substantially square, linear, stepwise linear, curved, curved linear, angular, conical and combinations thereof, to name just a few. Preferably it is substantially rounded to facilitate a smooth layer growth of the LED structure. This is illustrated in FIG. 8A, which is a simplified cross sectional view of the device according to the present invention. The substrate may be optionally removed from the present device after the deposition of the LED structure is complete as illustrated in FIG. 8B. A portion of the particles may be surface fused together during the high temperature layer growth and may adhere to the LED structure even after substrate removal. Discrete conglomerates of phosphor particles are thus retained with the LED structure. In contrary to the conventional devices where the phosphor is applied externally, the phosphor moiety is an integral part of the LED structure in the present device. Optionally the optical member may be removed leaving behind cavities such as voids 15 and through holes 17 in the LED structure in the present device as illustrated in FIG. 8C. The cavities may be further filled with a foreign substance 19 in a way similar to what has been described earlier. This is illustrated in FIG. 8D, which is a simplified, cross sectional view of the device according to the present invention.

Figure 9A:
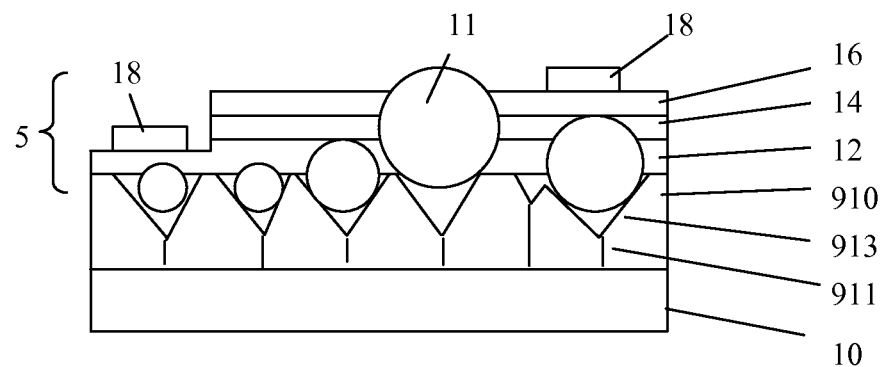
FIGS. 9A-9B are cross-sectional views illustrating an LED that has an inclusion of optical member spatially coupled to surface pits in a first layer and subsequent removal of the substrate and the first layer according to the present invention.
Figure 9B:
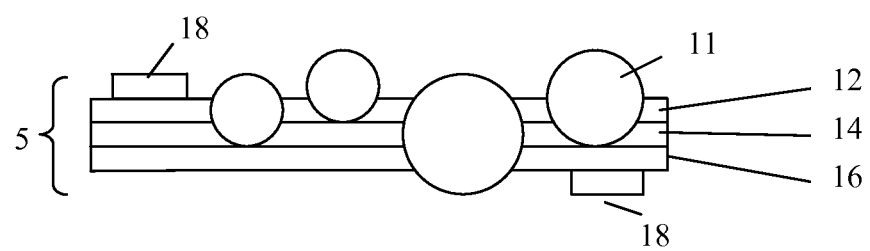

In still another embodiment of the device in the present invention, the optical member may be spatially coupled to a plurality of surface pits 913 in a first layer grown on the substrate. This is illustrated in FIG. 9A. The surface pits are largely associated with the misfit dislocation defects 911 from a first layer 910 deposited on the surface of a substrate 10. These defects are generated during the layer growth possibly due to differences in the lattice constant and differences in the thermal expansion coefficient between the layer and the substrate. The formation of etch pits has been described by Stocker et al in Applied Physics Letters 73(18) 1998 pg. 2654-2656. In brief, a first layer 910 is grown on a substrate 10 in a growth chamber using conventional methods such as MOCVD or HVPE. After the wafer is removed from the growth chamber, it may be optionally etched in a $H_3PO_4$ solution or a KOH solution. A plurality of surface pits 913 of various sizes is formed corresponding to the misfit dislocation defects 911 in the layer. A longer etching duration may be used to further magnify the pits to desirable sizes. The optical member is dispersed in a solution and then dispensed on the surface of the first layer using conventional spin coating or tapered cell methods. This way the optical member is spatially coupled to the site of the surface pits 913. The smaller particles tend to settle in the pits, while the larger ones tend to ride on the pits. After the wafer is cleaned and dried, it is reloaded in the growth chamber and an LED structure is grown comprising a layer of the first conductivity type 12, an active layer 14, and a layer of the second conductivity type 16. After the LED structure is complete, the wafer is removed from the growth chamber and separate contact electrodes 18 are formed on the surface of the layers of each conductivity type. In this embodiment, the substrate 10 may be temporary and can be optionally removed from the structure. This is advantageous when the starting substrate is light absorbing. Optionally the first layer 910 may be also removed from the LED structure during wafer processing to avoid possible optical losses from the defective layer. This can be achieved by using conventional methods such as lapping, etching, laser lift off, and kiss polishing. This is illustrated in FIG. 9B, which is a simplified, cross sectional view of the device according to the present invention.

Figure 10A:
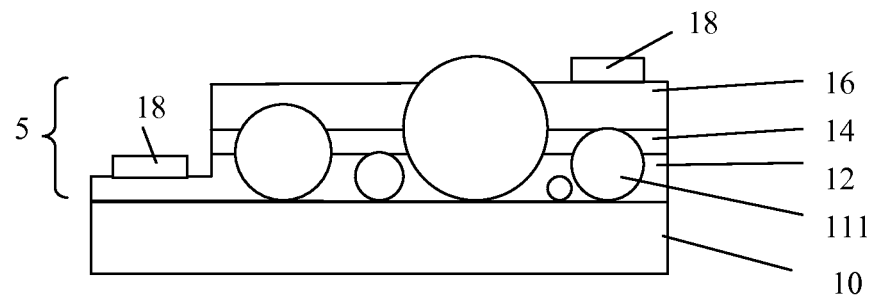
FIGS. 10A-10C are cross-sectional views illustrating an LED that includes an optical member such as phosphor particles in the LED structure, subsequent surface leveling, and substrate removal according to the present invention.

A different situation arises when an absorbing particle is employed in the optical member of the device in the present invention. In particular, the optical member comprises at least one type of particles that absorbs a portion of the radiation in the first range of the spectrum from the active layer and emits a radiation in a second range of the spectrum. This is illustrated in FIG. 10A, which is a simplified, cross sectional view of the device according to the present invention. The present device can be fabricated in a way similar to that described earlier. In brief, the light-emitting structure is grown on a substrate 10 comprising a lower layer of the first conductivity type 12, an active layer 14, and an upper layer of the second conductivity type 16. Separate contact electrodes 18 are formed connecting the layers of each conductivity type. An optical member 111 such as a fluorescent material, e.g., a phosphor, is applied to the substrate surface before growing the LED structure. In this example, the optical member 111 is seeded in the light emitting structure from the substrate side. The present device has a plurality of discontinuities in the light emitting structure bordering the optical member 111. These discontinuities serve as end faces for light to exit. Unlike the case for the transparent particles, the trapped light radiating out near the discontinuities is almost immediately absorbed in the proximity of the optical member in the present LED structure. The optical member is effectively excited and emits an efficient radiation in a second range of the spectrum. Thus the light conversion efficiency is high in the present device. Since the converted light is substantially transparent to the active region, it will not be absorbed in the active region. Thus the absorption loss is much reduced in the present LED. These benefits are significant, new and unexpected for one skilled in the field using the conventional LED design.

Examples of the optical member in the present device may be a typical light conversion material such as a phosphor, e.g., a garnet phosphor, silicate phosphor, nitride phosphor, sulfide phosphor, and combinations thereof. The phosphor particle can be a solid or a core-shell particle of a variety of kinds, sizes and shapes in the present device. Preferably it is substantially rounded in shape to facilitate a smooth growth of the light emitting structure. The phosphor particle can be of few nm to 50 µm in size, preferably 0.1 µm to 10 µm in size. The phosphor particles can be synthesized using a top-down scheme, e.g., sintering and milling, or using a bottom-up scheme, e.g., spray pyrolysis, sol-gel process. The making of phosphor particles is has been described by Hafiz et al in US Publication No. 20100200808, by Kamiyama et al in J. Electrochemical Society 157(5) 2010 pg. J1494154, by Jia et al in J. Electrochemical Society 154(1) 2007 pg. J1-J4, by Purwanto et al in J. Electrochemical Society 154(3) 2007 pg. J91-J96.

For clarity, the particle in this embodiment of the device in the present invention may represent a single light conversion particle, an aggregate of light conversion particles, or an agglomerate of light conversion particles. It may represent at least one kind of light conversion material or a mixture of different light conversion materials. The light conversion particle can be of a variety of sizes and distribution. For example, the size distribution can be Gaussian, non-Gaussian, lognormal, skew normal, single modal, bimodal, multi-modal, to name just a few. The median size and spread of the distribution can be the same or different. By using a GaN LED structure that emits a blue light around 450 nm to 460 nm, a phosphor that absorbs in blue and emits in the yellow-green may be used as the optical member to generate white light in the present device. Exemplary phosphors include garnet phosphors such as cerium-doped yttrium-aluminum garnet $Y_3Al_5O_{12}$ (YAG) and silicate phosphors such as europium-doped ortho-silicate phosphor $(Ba, Sr)SiO_4$, phosphate phosphors, and sulfur-containing phosphors. A nitride phosphor such as SiAlON phosphor, $CaAlSiN_3$ phosphor may be added for better stability and color fidelity. By choosing the type and weight of the phosphor for the optical member in the present device, the radiation in a second range of the spectrum emitted by the optical member and the radiation in the first range of the spectrum from the active layer can be color mixed and perceived as white to the naked eye. In the some conventional LED packages for white light generation, an LED chip made of GaN material is sealed in a resin sealant such as silicone. The phosphor particles are suspended in the resin and can absorb the blue light coming out of the GaN LED. The blue light emitted from the active region must exit the chip, travel through the resin before hitting the phosphor particle to initiate the light conversion process. In this effort, the light suffers undesirable losses every time it comes across the many interfaces. This would impair the light conversion efficiency of the device. The situation is entirely different using the devices in this invention. In specific, the present LED device is a composite of both the light emitting structure and the phosphor. That means: the phosphor particle becomes an integral part of the chip. Unlike the prior art devices, the present device allows for light mixing in-situ in the LED structure. The issue of optical loss at interfaces is thus effectively alleviated. As a result, the present device is most suitable for efficient white light generation at a reduced packaging cost. These benefits are significant, unique and unexpected for one skilled in the field using the conventional LED design.

Figure 10B:
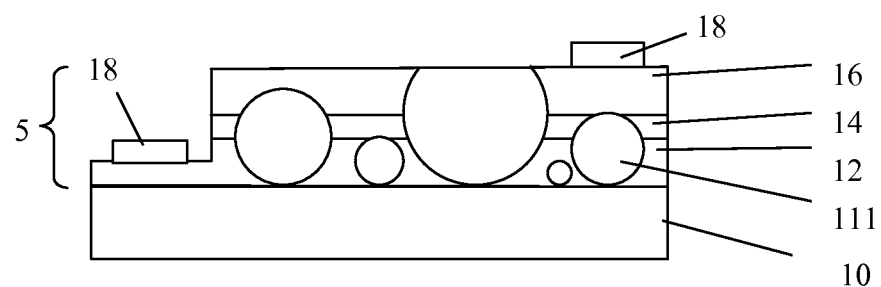
Figure 10C:
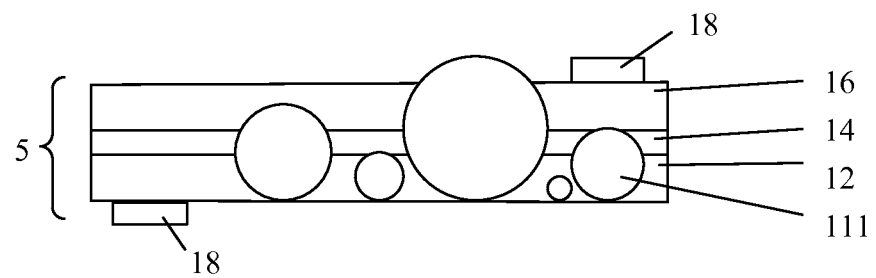
Figure 11A:
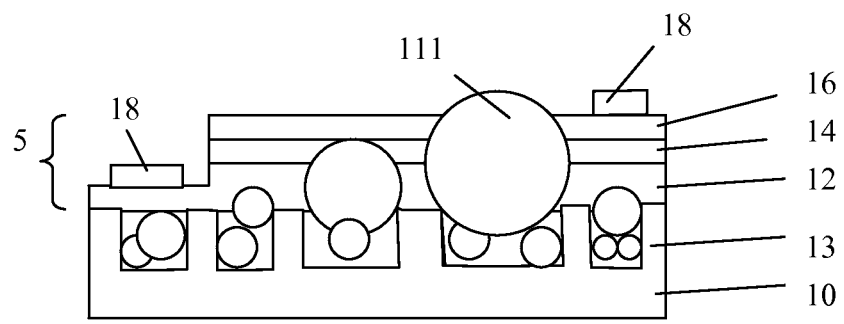
FIGS. 11A-11C are cross-sectional views illustrating an LED that includes an optical member such as phosphor particles spatially coupled to a textured district, subsequent substrate removal, and surface leveling according to the present invention.

As illustrated in FIG. 10A, a portion of the optical member such as a phosphor particle in this case may protrude the surface of the light emitting structure. For easy processing, the light emitting structure may be optionally leveled to render a flat surface of the LED structure as illustrated in FIG. 10B. To improve heat dissipation and to reduce substrate absorption, the substrate 10 in the present device may be temporary and can be optionally removed using conventional methods such as lapping, etching or laser lift off. As a result, the device performance is further improved. This is illustrated in FIG. 10C, which is a simplified, cross sectional view of the device according to another embodiment of the present invention. By forming a textured district of a desirable pattern defined on the surface of the substrate 10 before the LED structure is grown, the optical member 111 such as a phosphor can be disposed and spatially coupled to the textured district at the predetermined sites as illustrated in FIG. 11A. The textured district may comprise a plurality of ditches 13 in the form of a cavity, trench, mound, mesa, plateau, growth post and combinations thereof. By choosing the size of the particle, the optical member such as phosphor particles of different sizes and types may be spatially coupled to the ditches into separate planes. For example, the smaller phosphor particles may be caught in the cavities while the type of phosphor having a larger particle size is more likely to ride upon the cavities. As a result, the phosphors are spatially located in different planes. The present device thus provides a new degree of freedom using precision layered phosphors to fine tune the color balance of the light output.

Figure 11B:
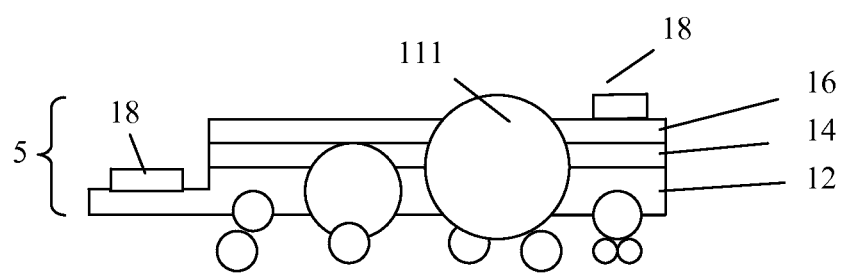
Figure 11C:
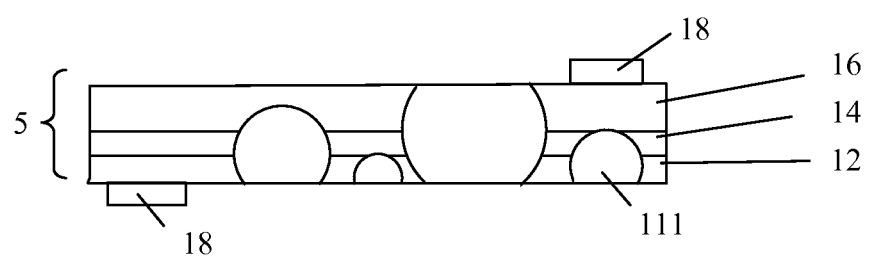
Figure 12A:
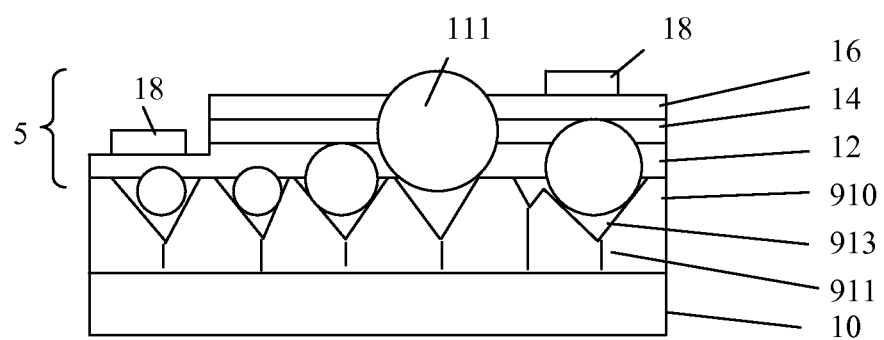
FIGS. 12A-12B are cross-sectional views illustrating an LED that includes an optical member such as phosphor particles spatially coupled to surface pits, and subsequent removal of the substrate and the first layer according to the present invention.
Figure 12B:
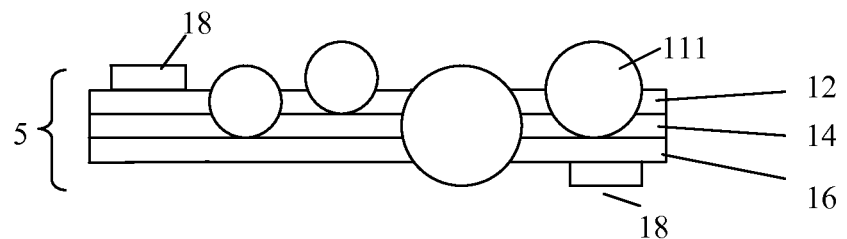

Optionally the substrate 10 can be temporary in the presently described LED manufacturing method. The substrate 10 can be removed from the structure by the convenient methods such as lapping, etching or laser lift off. This is illustrated in FIG. 11B. The particles are likely surface fused into conglomerates at the high temperature during the growth of the LED structure. A portion of the optical member 111 such as a phosphor may protrude the surface of the light emitting structure. Optionally the LED structure may be leveled using conventional methods such as kiss polishing to render a flat surface of the LED structure. This is illustrated in FIG. 11C, which is a simplified, cross sectional view of the device according to another embodiment of the present invention. Alternatively, the optical member such as phosphor particles may be spatially coupled to a plurality of surface pits 913 in a first layer grown on the substrate 10 as illustrated in FIG. 12A. The surface pits correspond to misfit dislocation defects 911 in the first layer 910. For example, the phosphor particles are dispersed in a solution and are dispensed on the etched surface of the first layer using conventional spin coating or tapered cell methods. This way the optical member 111 is spatially coupled to the sites of the surface pits 913. Optionally the substrate 10 and the first layer 910 may be removed from the LED structure during wafer processing by using conventional methods such as lapping, etching and kiss polishing. This is illustrated in FIG. 12B, which is a simplified, cross sectional view of the device according to the present invention.

The present device can be readily used to fabricate various types of the conventional LED packages, modules, and systems. In another embodiment of the present invention, the present devices are further incorporated in a form of wire bonding, flip chip bonding, thin film bonding, surface mounted, power package configuration. A control system including a control IC, a driver, a power supply and a lamp are put together with the module. A heat sink and a secondary optics are added to the assembly to form a complete lighting system. The present device can be in a backlighting unit for display applications in optoelectronic systems such as LED TV, monitor, mobile phone. The present device can be also used as a light source in general lighting applications such as a lamp, vehicle headlight, street lamp, to name just a few.

There are other benefits from the unique features of the devices illustrated in the embodiments of the present invention. For example, the abundant end faces in the present LED structure allows for a quick exit of the trapped light. Thus the present devices are most beneficial for the fabrication of large chips which suffer more severe light trapping.

To those skilled in the art, it is apparent that there are alternations and modifications either implied from or suggested by the teaching such as the description and the drawings in the present invention. Accordingly, the present invention is to be limited solely by the scope of the following claims.

What is claimed is:

1. A light-emitting device, comprising:
a light emitting structure comprising a lower layer of a first conductivity type, an active layer, an upper layer of a second conductivity type, wherein the light emitting structure is configured to emit light;
a first electrode connected to the lower layer of the first conductivity type;
a second electrode connected to the upper layer of the second conductivity type; and
a non-absorbing optical member, wherein at least a portion of the non-absorbing optical member is positioned in the active layer of the light emitting structure, wherein the non-absorbing optical member comprises a plurality of particles that are substantially transparent to the light emitted from the light emitting structure, wherein the optical member has a lower refractive index than the lower layer, the active layer, or upper layer in the light emitting structure, wherein a plurality of discontinuities are formed at the boundary of the optical member in the light emitting structure.

2. The light-emitting device of claim 1, wherein a different portion of the optical member is positioned in the light emitting structure through the lower layer.

3. The light-emitting device of claim 1, wherein the light emitting structure comprises materials selected from the group of III-V, IV, II-VI semiconductor materials.

4. The light-emitting device of claim 1, wherein the optical member comprises solid or hollow particles of uneven sizes, shapes, and spacing.

5. The light-emitting device of claim 1, wherein a portion of the optical member protrudes out of an outer surface of the light emitting structure.

6. The light-emitting device of claim 1, wherein the light emitting structure comprises a flat upper surface.

7. The light-emitting device of claim 1, further comprising:
a substrate comprising a first surface, wherein the light emitting structure is disposed on the first surface of the substrate.

8. The light-emitting device of claim 7, wherein the substrate is selected from the group consisting of a group III-V material, a group IV material, a group II-VI material, alloys, ZnO, spinel, and sapphire.

9. The light-emitting device of claim 7, further comprising a textured district defined on the first surface of the substrate, comprising a plurality of ditches in the form of a cavity, trench, mound, mesa, plateau, growth post and combinations thereof, the optical member is spatially coupled to the textured district.

10. The light-emitting device of claim 7, further comprising a first layer disposed on the first surface of the substrate having a plurality of surface pits from the misfit dislocation defects in the first layer, wherein the optical member is spatially coupled to the plurality of surface pits.

11. The light-emitting device of claim 1, wherein the optical member comprises a cavity in the light emitting structure.

12. The light-emitting device of claim 11, wherein the cavity contains a gas, a phosphor material, a resin, a metallic material, a reflective material, a semiconductor material, a ceramic material, a conductive material, or a heat dissipating material.

13. An optoelectronic system for lighting and display applications, comprising the light-emitting device of claim 1, which is incorporated in the form of wire bonding, flip chip bonding, surface mounted, or power package.

14. A light-emitting device, comprising:
a light emitting structure comprising a lower layer of the first conductivity type, an active layer, an upper layer of the second conductivity type;
a first electrode connected to the lower layer of the first conductivity type;
a second electrode connected to the upper layer of the second conductivity type; and
an optical member seeded in the light emitting structure, wherein the optical member comprises particles that absorb a portion of the radiation in a first range of the spectrum from the active layer and emits a radiation in a second range of the spectrum, wherein a plurality of discontinuities are formed at the boundary of the optical member in the light emitting structure, wherein a portion of the optical member protrudes out of an outer surface of the light emitting structure.

15. The light-emitting device of claim 14, wherein the optical member comprises phosphor.

16. The light-emitting device of claim 14, wherein the optical member is seeded in the light emitting structure through the lower layer.

17. The light-emitting device of claim 14, wherein the radiation in a second range of the spectrum emitted by the optical member and the radiation in the first range of the spectrum from the active layer are color mixed and perceived as white to the naked eye.

18. The light-emitting device of claim 14, wherein the light emitting structure comprises a flat upper surface.

19. The light-emitting device of claim 14, further comprising:
a substrate comprising a first surface, wherein the light emitting structure is disposed on the first surface of the substrate.

20. The light-emitting device of claim 19, further comprising:
a textured district on the first surface of the substrate whereupon the light emitting structure is disposed, wherein the textured district comprises a plurality of ditches in the form of a cavity, trench, mound, mesa, plateau, growth post, or a combination thereof, wherein the optical member is spatially coupled to the textured district.

21. The light-emitting device of claim 19, further comprising a first layer disposed on the first surface of the substrate having a plurality of surface pits from the misfit dislocation defects in the first layer, wherein the optical member is spatially coupled to the plurality of surface pits.

22. An optoelectronic system for lighting and display applications, comprising the light-emitting device in claim 14, which is incorporated in wire bonding, flip chip bonding, surface mounted, or power package.

* * * * *